United States Patent
Li et al.

(10) Patent No.: US 7,868,335 B1
(45) Date of Patent: Jan. 11, 2011

(54) MODULATION DOPED SUPER-LATTICE SUB-COLLECTOR FOR HIGH-PERFORMANCE HBTS AND BJTS

(75) Inventors: James Chingwei Li, Simi Valley, CA (US); Marko Sokolich, Los Angeles, CA (US); Tahir Hussain, Calabasas, CA (US); David H. Chow, Newbury Park, CA (US)

(73) Assignee: HRL Laboratories, LLC, Malibu, CA (US)

( * ) Notice: Subject to any disclaimer, the term of this patent is extended or adjusted under 35 U.S.C. 154(b) by 180 days.

(21) Appl. No.: 12/193,436

(22) Filed: Aug. 18, 2008

(51) Int. Cl.
*H01L 21/20* (2006.01)

(52) U.S. Cl. .......................... 257/79; 257/94; 257/103; 257/194; 257/198; 257/201; 257/E21.125; 257/E21.127; 257/E21.603; 257/E27.012; 257/E27.128; 257/E29.022; 257/E29.066; 257/E29.114; 257/E29.189; 257/E31.073; 438/207; 438/268; 438/302; 438/309; 438/319

(58) Field of Classification Search ............. 257/77–79, 257/94–103, 194–201, E21.125, E21.127, 257/E21.603, E27.012, E27.128, E29.027, 257/E29.066, E29.114, E29.189, E31.073, 257/E33.045; 438/207, 239, 268, 302–309, 438/319–325, 393
See application file for complete search history.

(56) References Cited

U.S. PATENT DOCUMENTS

| | | | | |
|---|---|---|---|---|
| 4,821,082 A * | 4/1989 | Frank et al. | ............... | 257/198 |
| 4,899,200 A * | 2/1990 | Shur et al. | ............... | 257/194 |
| 5,323,030 A * | 6/1994 | Koscica et al. | ............... | 257/195 |
| 5,557,131 A * | 9/1996 | Lee | ............... | 257/370 |
| 5,981,343 A * | 11/1999 | Magri et al. | ............... | 438/268 |
| 6,281,521 B1 * | 8/2001 | Singh | ............... | 257/77 |
| 6,288,415 B1 * | 9/2001 | Leong et al. | ............... | 257/94 |
| 6,313,488 B1 * | 11/2001 | Bakowski et al. | ............... | 257/198 |
| 6,797,577 B2 * | 9/2004 | Johnson et al. | ............... | 438/309 |
| 7,019,332 B2 * | 3/2006 | Vieira et al. | ............... | 257/82 |
| 7,390,720 B2 * | 6/2008 | Pagette | ............... | 438/309 |
| 7,453,084 B2 * | 11/2008 | Nowak et al. | ............... | 257/30 |
| 7,535,034 B2 * | 5/2009 | Walter et al. | ............... | 257/197 |
| 2003/0007533 A1 * | 1/2003 | Bosco et al. | ............... | 372/50 |
| 2003/0010984 A1 * | 1/2003 | Bosco et al. | ............... | 257/79 |

OTHER PUBLICATIONS

T. Arai, et al. "Proposal of Buried Metal Heterojunction Bipolar Transistor and Fabrication of HBT with Buried Tungsten" 11th International Conference on Indium Phosphide and Related Materials, pp. 183-186 (1999).

Yasuyuki Miyamoto, et al. "Tungsten buried growth by using thin flow-liner for small collector capacitance in InP HBT" International Conference on Indium Phosphide and Related Materials, pp. 90-93 (2005).

* cited by examiner

*Primary Examiner*—Michael S Lebentritt
(74) *Attorney, Agent, or Firm*—Ladas & Parry (57) ABSTRACT

A bipolar junction transistor having an emitter, a base, and a collector includes a stack of one or more layer sets adjacent the collector. Each layer set includes a first material having a first band gap, wherein the first material is highly doped, and a second material having a second band gap narrower than the first band gap, wherein the second material is at most lightly doped.

41 Claims, 10 Drawing Sheets

FIG. 1
PRIOR ART

| Material | Type | Doping Level (cm⁻³) | Thickness (nm) | Description | |
|---|---|---|---|---|---|
| InGaAs | n | 3*10^19 | 40 | Emitter Cap | 86 |
| InP | n | 3*10^19 | 20 | Emitter Cap | 84 |
| InP | n | 1*10^19 | 20 | High doped emitter | 82 |
| InP | n | 1*10^18 | 40 | Low doped emitter | 80 |
| InGaAs | p | 3*10^19 | 35 | Base | 76 |
| InP/Grade | n | 1*10^16 | 120 | Low doped collector | 74 |
| InP | n | 2*10^19 | 25 | High Doped Collector | 72 |
| InGaAs | n | 2*10^19 | 10 | N++ contact layer and etch stop | 70 |
| InP | n | 2*10^19 | 5.0 | N++ sub-collector cap layer | 68 |
| InP | n | 1*10^17 | 2.5 | Spacer, moves ionized donors away from 2DEG | 66 |
| InP | n | 2*10^19 | 5.0 | Doping Pulse | 64 |
| InP | n | 1*10^17 | 2.5 | Spacer, moves ionized donors away from 2DEG | 62 |
| InGaAs | n | 5*10^15 | 5.0 | Etch stop and channel layer | 60 |
| InP | n | 1*10^17 | 2.5 | Spacer, moves ionized donors away from 2DEG | 58 |
| InP | n | 2*10^19 | 5.0 | Doping Pulse | 56 |
| InP | n | 1*10^17 | 2.5 | Spacer, moves ionized donors away from 2DEG | 54 |
| InGaAs | n | 5*10^15 | 5.0 | Etch stop and channel layer | 52 |
| InP | Semi-Insulating | N/A | N/A | Substrate | 50 |

FORMING A STACK OF ONE OR MORE LAYER SETS ON A SUBSTRATE WHEREIN THE STACK IS FORMED BEFORE FORMING A COLLECTOR AND WHEREIN EACH LAYER SET INCLUDES :   200

A FIRST MATERIAL HAVING A FIRST BANDGAP AND WHEREIN THE FIRST MATERIAL IS HIGHLY DOPED;

A SECOND MATERIAL HAVING A SECOND BANDGAP NARROWER THAN THE FIRST BANDGAP, THE SECOND MATERIAL BEING UNDERNEATH THE FIRST MATERIAL AND WHEREIN THE SECOND MATERIAL IS AT MOST LIGHTLY DOPED;

A THIRD MATERIAL BETWEEN THE FIRST MATERIAL AND THE SECOND MATERIAL, WHEREIN THE THIRD MATERIAL IS OF THE SAME MATERIAL AS THE FIRST MATERIAL, AND WHEREIN THE THIRD MATERIAL IS LIGHTLY DOPED COMPARED TO THE DOPING OF THE FIRST MATERIAL; AND     A FOURTH MATERIAL OVERLYING THE FIRST MATERIAL, WHEREIN THE FOURTH MATERIAL IS OF THE SAME MATERIAL AS THE FIRST MATERIAL, AND WHEREIN THE FOURTH MATERIAL IS LIGHTLY DOPED COMPARED TO THE DOPING OF THE FIRST MATERIAL.

DIFFUSING AN ADVANCING COLLECTOR CONTACT TO  244
COUPLE TO THE FIRST, SECOND, THIRD AND FOURTH
MATERIAL IN EACH LAYER SET

FIG. 6E

250
IMPLANTING IONS IN A REGION IN THE FIRST, SECOND,
THIRD AND FOURTH MATERIAL IN EACH LAYER SET

PREPARING THE WAFER FOR RE-GROWTH  252
AFTER ION IMPLANTATION.

FIG. 7

MODULATION DOPED SUPER-LATTICE SUB-COLLECTOR FOR HIGH-PERFORMANCE HBTS AND BJTS

FIELD

This disclosure relates to bipolar junction transistors (BJTs) and heterojunction bipolar transistors (HBTs), and in particular subcollectors for BJTs and HBTs.

BACKGROUND

In order to improve the performance of BJT and HBT III-V devices, including GaAs, InP and InGaAs devices, it is desirable to lower the collector resistance. Prior art methods to decrease the collector resistance are nearing their limit. These limits are the solid solubility of dopant, especially in III-V semiconductors, and issues with thickness which cause planarization issues in the fabrication of BJT and HBT devices.

In the prior art to make low resistance contact to the intrinsic low doped collector an epitaxially grown semiconductor sub-collector layer or a series of sub-collector layers, if etch stops are required, are used. The doping concentration and thickness of these sub-collector layers are increased to lower the sub-collector resistance. However, as discussed above, there are limits to the doping concentration and thickness.

For a high performance HBT with an n-type collector, a conventional sub-collector would have an n-type doping concentration of $2*10^{19}$ cm$^{-3}$, an approximate thickness of 300 nm, and be composed of InP and InGaAs layers to provide etch stops, good contact resistance, and good thermal conductivity. Doping of InP and InGaAs alloys has been demonstrated at greater than $2*10^{19}$ cm$^{-3}$ levels, but these highly doped layers are only grown in the emitter of an HBT, not the collector of an HBT. A high level doping in the emitter cap layers is possible, because there are no HBT layers above the emitter in an emitter up configuration, and therefore compromising the crystal quality does not adversely affect the HBT. This trade-off cannot be made in the sub-collector where the collector, base, and emitter have yet to be grown. In addition, a 300 nm thick sub-collector could represent 30-50% of the total HBT height. The topography produced by mesa isolation can have a significant negative impact on any subsequent planarization steps during fabrication of a device.

Other prior art methods for reducing collector resistance are described in "Handbook of III-V Heterojunction Bipolar Transistors" by William Liu, Wiley-Interscience, Apr. 27, 1998. These methods of reducing the collector resistance include buried Tungsten sub-collector devices described in "Proposal of Buried metal Heterojunction Bipolar Transistor and Fabrication of HBT with Buried Tungsten" by T. Arai et al., IPRM 1999, pp. 183-186; "Tungsten buried growth by using thin flow-liner for small collector capacitance in InP HBT", by Y. Miyamoto et al., IPRM 2005, pp. 90-93; and "CBC Reduction in GaInAs/InP buried metal heterojunction bipolar transistor", T. Arai et al, IPRM 2000, pp. 254-257, which are incorporated herein by reference.

The disadvantages of using these prior art methods are as follows. First, materials re-growth with III-V materials is a relatively immature technology. Second, materials re-growth over a polycrystalline metal bar is required. The re-growth of InP and InGaAs alloys over such a dissimilar material compromises the material quality of the HBT. As a result, the diode characteristics, DC gain, and reliability are degraded and may not be usable in a commercial setting. Third, demonstration of these prior art technologies have only occurred at 2 μm emitter widths and the RF performance is poor (<50 GHz). This represents lower performance than the comparable GaAs SHBT (single HBT) technologies and is not competitive for high performance InP DHBTs (double HBTs). Fourth, the tungsten wires must be scaled as aggressively as the emitter width in order to ensure proper re-growth. In order to be compatible with advanced processing technology with only 250 nm wide emitters, an appropriate tungsten etch process to define 250 nm or narrower pitch lines must be developed. At present, no such process exists that is compatible with III-V device processing.

The prior art has also attempted to reduce collector resistance and solve the planarization issue by ion implanting an n-type dopant species into undoped or semi-insulating GaAs, InP, or InGaAs layers in order to create a conducting region. This conducting region is created without any topographical penalty; however, the conductivity of these implanted regions is not comparable to epitaxially grown material with equivalent thickness.

Figure 1:
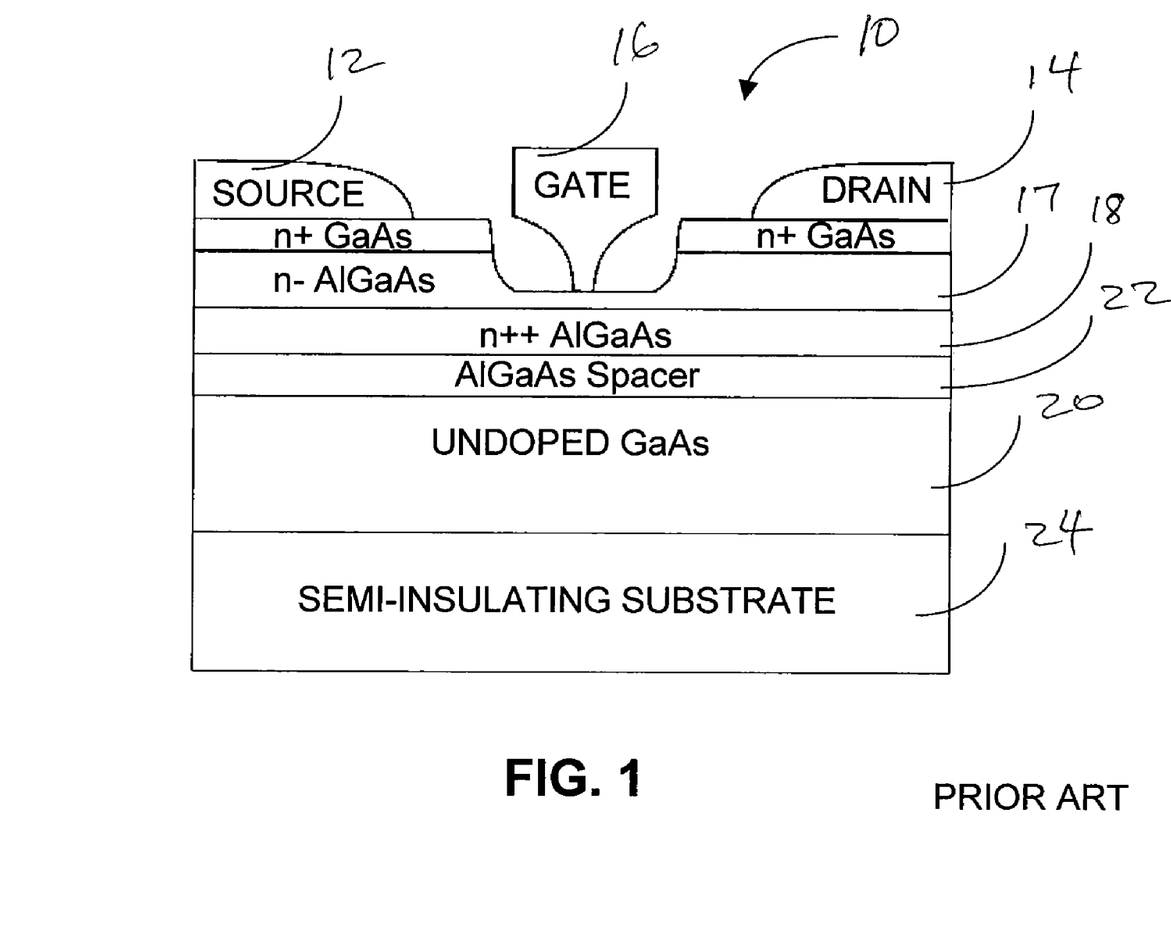
FIG. 1 is a elevation sectional view of an exemplary HEMT in accordance with the prior art.

The use of 2D electron gases for High Electron Mobility Transistor (HEMT) devices is described in "Physics of Semiconductor Devices" by Simon Sze, Wiley-Interscience, 2 edition, September 1981, which is incorporated herein by reference. FIG. 1 shows the cross-section for an exemplary prior art HEMT device 10, which is a type of field effect transistor (FET). In general a FET has a source 12, a drain 14, a channel between the source 12 and the drain 14, and a gate 16 that controls the flow of electrons between the source and the drain. In a FET the channel needs to be doped with impurities to generate mobile electrons in the channel. However, the doping causes electrons to slow down because they end up colliding with the impurities which were used to generate them in the first place. In a HEMT high mobility electrons are generated in a highly-doped wide-band gap n-type donor-supply layer 18, which is shown as made of AlGaAs in FIG. 1. A low doped barrier layer 17 separates the donor-supply layer 18 from the gate. Electrons from the donor-supply layer 18 are supplied to a non-doped narrow-band gap channel layer 20 with essentially no dopant impurities, which is shown as consisting of GaAs in FIG. 1. A spacer layer 22 is between the donor supply layer 18 and the channel layer 20. The spacer layer 22 is made of the same material AlGaAs as the donor-supply layer 18; however, the spacer layer 22 has little or no doping compared to the donor-supply layer 18 in order to keep the ionized donor electrons in the channel layer 20 of GaAs. The electrons generated in the n-type AlGaAs layer drop into the GaAs layer to form a depleted AlGaAs layer, because the heterojunction created by different bandgap materials in the donor supply layer 18 and the channel layer 20 forms a quantum well in the conduction band on the channel layer 20 GaAs side from which the electrons cannot escape. Once in the channel layer 20, the electrons can move quickly without colliding with any impurities because the GaAs layer is undoped. The effect of this is to create a very thin layer of highly mobile conducting electrons with very high concentration, giving the channel layer 20 between the source and the drain very low resistivity or "high electron mobility". This layer is called a two dimensional electron gas (2DEG).

Although a HEMT device has many useful applications, there are many other applications for which a HEMT or a FET device is not suitable. Other devices such as bipolar junction transistors (BJTs) and heterojunction bipolar transistors (HBTs) do not operate as FETs and do not have a channel controlled by a gate between a source and a drain. Rather a BJT has an emitter, base and collector and operates quite differently than a FET. An HBT also has an emitter, base and collector.

What is needed are lower resistance collectors in BJTs and HBTs to improve their performance. Also needed are methods for lowering the collector resistance of BJTs and HBTs. The embodiments of the present disclosure answer these and other needs.

SUMMARY

In a first embodiment disclosed herein, a bipolar junction transistor having an emitter, a base, and a collector comprises a stack of one or more layer sets adjacent the collector wherein each layer set comprises a first material having a first band gap and wherein the first material is highly doped, and a second material having a second band gap narrower than the first band gap, wherein the second material is at most lightly doped.

In another embodiment disclosed herein, a heterojunction bipolar transistor having an emitter, a base, and a collector comprises a stack of one or more layer sets adjacent the collector wherein each layer set comprises a first material having a first band gap and wherein the first material is highly doped, and a second material having a second band gap narrower than the first band gap, wherein the second material is at most lightly doped.

In yet another embodiment disclosed herein, a method of fabricating a heterojunction bipolar transistor having an emitter, a base, and a collector comprises forming a stack of one or more layer sets on a substrate wherein the stack is formed before forming the collector and wherein each layer set comprises a first material having a first band gap and wherein the first material is highly doped, a second material having a second band gap narrower than the first band gap, wherein the second material is at most lightly doped, a third material between the first material and the second material, wherein the third material is of the same material as the first material, and wherein the third material is lightly doped compared to the doping of the first material, and a fourth material overlying the first material, wherein the fourth material is of the same material as the first material, and wherein the fourth material is lightly doped compared to the doping of the first material.

These and other features and advantages will become further apparent from the detailed description and accompanying figures that follow. In the figures and description, numerals indicate the various features, like numerals referring to like features throughout both the drawings and the description.

DETAILED DESCRIPTION

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

Figure 2:
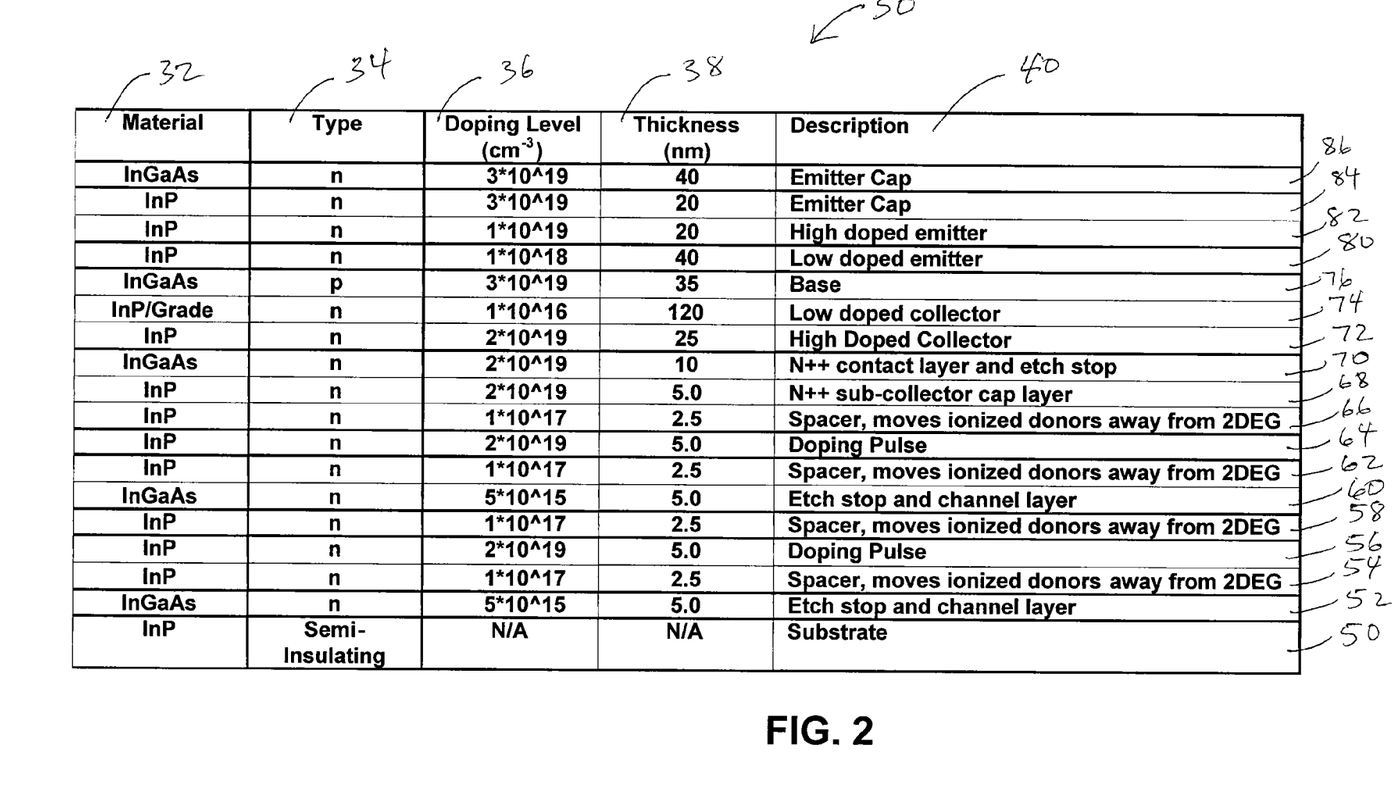
FIG. 2 is a table showing the material, material type, doping level, thickness and description of the layers of an exemplary HBT with a modulation doped super-lattice sub-collector in accordance with the present disclosure.

Referring to FIG. 2, table 30 shows the details of each layer for an exemplary HBT fabricated with a modulation doped super-lattice sub-collector, in accordance with the present disclosure. The details for each layer include the layer material 32, the doping type 34, the doping level 36, the layer thickness 38, and the layer description 40.

The exemplary embodiment shown in FIG. 2 is for a device based on indium phosphide (InP) material; however, it should be understood that other materials can be used. Also the materials used for the intrinsic low doped collector 74, the base 76, and the low doped emitter layer 80 in FIG. 2 can be altered to other materials that form a functional BJT or HBT. Also, the doping concentrations and layer thicknesses may be altered for the specific materials used in practice.

In table 30 of FIG. 2, the first layer is substrate layer 50, which is semi-insulating and of indium phosphide (InP) material. A modulation doped super-lattice (MDSL) sub-collector in accordance with this invention is formed on top of the substrate layer 50 and comprises a stack of one or more MDSL layer sets. In FIG. 2 a first MDSL layer set includes indium gallium arsenide (InGaAs) channel layer 52 with a $5*10^{15}$ doping level and a 5 nm thickness, InP spacer layer 54 with a $1*10^{17}$ doping level and a 2.5 nm thickness, InP doping pulse layer 56 with a $2*10^{19}$ doping level and a 5 nm thickness, and InP spacer layer 58 with a $1*10^{17}$ doping level and a 2.5 nm thickness. A second MDSL layer set in FIG. 2 includes indium gallium arsenide (InGaAs) channel layer 60 with a $5*10^{15}$ doping level and a 5 nm thickness, InP spacer layer 62 with a $1*10^{17}$ doping level and a 2.5 nm thickness, InP doping pulse layer 64 with a $2*10^{19}$ doping level and a 5 nm thickness, and InP spacer layer 66 with a $1*10^{17}$ doping level and a 2.5 nm thickness.

The exemplary HBT with a MDSL sub-collector shown in FIG. 2, uses InP and InGaAs in the MDSL layer sets; however, it should be understood that InP can be replaced with any material with a wide band gap and InGaAs can be replaced with any material with a narrower band gap. For example, a band gap for InP may be 1.35 eV, while the band gap for InGaAs may be 0.4 eV. In semiconductors electrons are confined to a number of bands of energy, and forbidden from other regions. The term "band gap" refers to the energy difference between the top of the valence band and the bottom of the conduction band. A narrower band gap provides greater conductivity and lower resistance.

Electrons generated in a doping pulse layer, such as doping pulse layer 56, drop into a channel layer, such as channel layer 52, because the heterojunction created by the different bandgap materials in the doping pulse layer and the channel layer forms a quantum well in the conduction band of the channel layer, which keeps the electrons in the channel layer.

A doping pulse layer in an MDSL layer set, such as doping pulse layer 56, can provide electrons to a channel layer, such as channel layer 52, due to the relatively high doping levels of the doping pulse layers. A channel layer in each MDSL layer set, such as channel layer 52, has a relatively low doping level, which provides increased electron mobility, because the electrons can move quickly without colliding with any impurities. An MDSL layer set includes at the minimum a doping pulse layer 56 and a channel layer 52.

Spacer layers may be included in each MDSL layer set. The spacer layers in each MDSL layer set, such as spacer layers 54 and 58, have low doping compared to a doping pulse layer. A spacer layer, such as spacer layer 58, separates one MDSL layer set from another MDSL layer set. For example, in FIG. 2, spacer layer 58 separates doping pulse layer 56 in the first MDSL layer set from channel layer 60 in the second MDSL layer set. A spacer layer, such as spacer layer 54, is between a doping pulse layer and a channel layer and functions to keep the electrons in the channel layer.

Although table 30 in FIG. 2 shows two MDSL layer sets, the number of MDSL layer sets can be from one MDSL layer set to as many MDSL layer sets as necessary to achieve a desired resistance for the sub-collector.

For HEMTs with an InGaAs channel, surface charge densities on the order of $3*10^{12}$ cm$^{-2}$ are common and can carry 1 mA/mm of current density. Thus, to handle the current drive of a 2 mA/µm InP double HBT (DHBT), two MDSL layer sets may be sufficient; however, additional MDSL layer sets may be included in the MDSL sub-collector to further reduce the sub-collector resistance and increase the current drive capability. As shown in table 30 in FIG. 2, a MDSL layer set, such as the MDSL layer set that includes channel layer 52, spacer layer 54, doping pulse layer 56, and spacer layer 58, may require a 15 nm thickness of semiconductor material. Thus, ten stacked MDSL layer sets would require 150 nm of total sub-collector thickness, which is a 50% reduction in thickness compared to a conventional sub-collector, which as discussed above is about 300 nm in thickness. An MDSL sub-collector with ten stacked MDSL layer sets of the composition described in table 30 of FIG. 2 would have a sheet resistance approximately the same as a 10-12 ohms/sq sheet resistance for a conventional InP/InGaAs composite sub-collector. The MDSL sub-collector also provides superior carrier mobility (3×) compared to a conventional sub-collector.

The higher conductivity of the MDSL sub-collector provides improved HBT performance and the lower thickness reduces planarization issues during fabrication of an HBT.

The layers 68, 70, 72, 74, 76, 80, 82, 84 and 86 above the MDSL sub-collector in table 30 for the exemplary HBT of FIG. 2, include the normal layers that would be above a conventional sub-collector. The layers include a sub-collector cap 68 made of InP, a contact and etch stop 70 made of InGaAs, a highly doped collector 72 made of InP, a low doped collector 74, which is the intrinsic collector, made of InP, a base 76 made of InGaAs, a low doped emitter 80, which is the intrinsic emitter, made of InP, a high doped emitter 82 made of InP, an emitter cap 84 made of InP, and an emitter cap 86 made of InGaAs.

Figure 3:
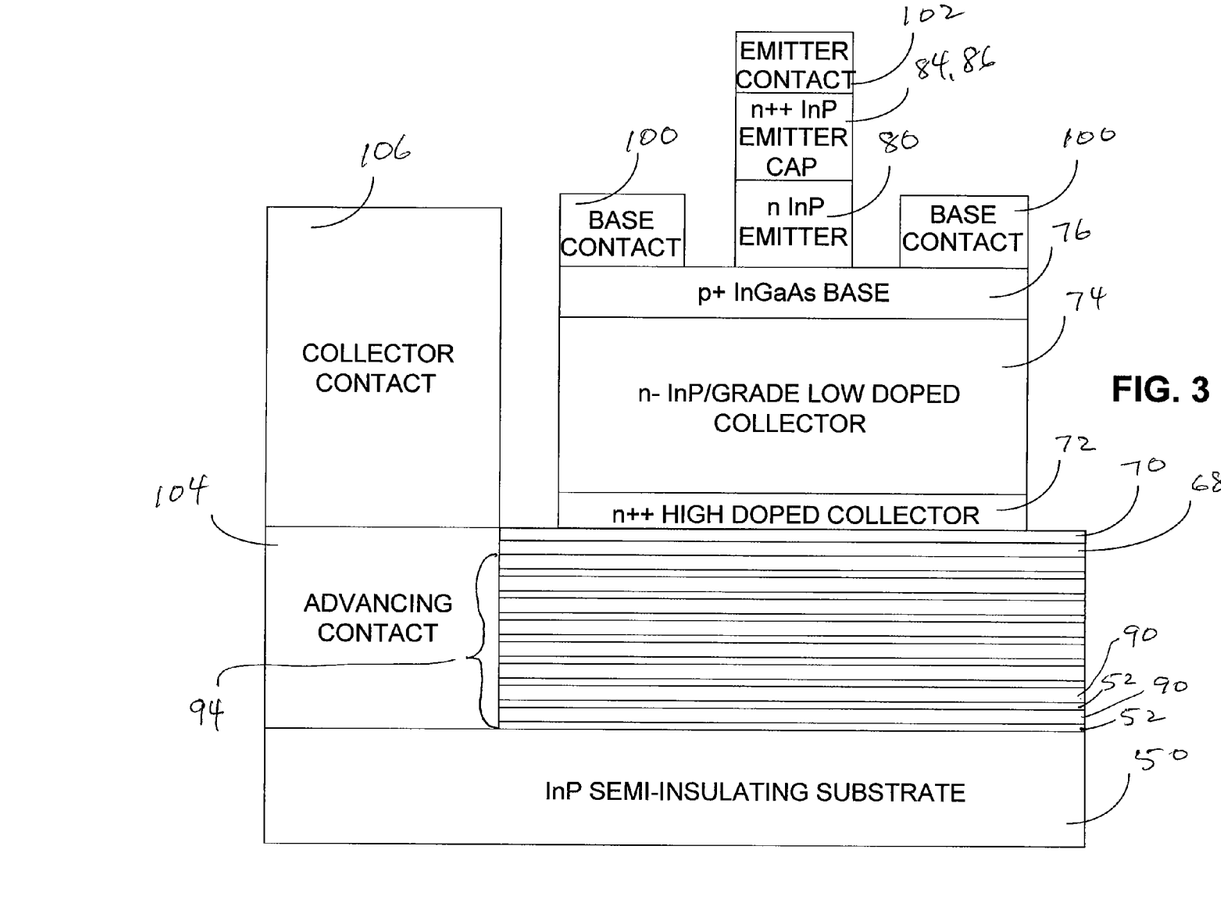
FIG. 3 is an elevation sectional view of an exemplary HBT with a modulation doped super-lattice sub-collector in accordance with the present disclosure.

FIG. 3 is an elevation sectional view of an exemplary HBT with a modulation doped super-lattice sub-collector in accordance with the present disclosure. In FIG. 3 the HBT has a MDSL sub-collector 94 with a stack of eight MDSL layer sets. The first MDSL layer set includes channel layer 52 and layer group 90. In FIG. 3 the spacer layer 54, doping pulse layer 56 and spacer layer 58 are shown together as layer group 90. The second MDSL layer set includes channel layer 52 and layer group 90, which also includes a spacer layer, a doping pulse layer and another spacer layer. The third through eighth MDSL layer sets have the same composition as the first and second MDSL layer sets.

Above the eight MDSL layer sets in FIG. 3 are the layers forming the HBT as previously discussed in reference to FIG. 2. Also shown is base contact 100 and emitter contact 102, which are not included in FIG. 2. These contacts may be made of gold (Au).

To contact each MDSL layer set in the MDSL sub-collector, an advancing contact 104 is diffused into a region of the MDSL sub-collector. An advancing contact may also be referred to as a diffusing or sinking contact. The advancing contact can be gold (Au), germanium (Ge) and nickel (Ni). A surface contact 106, which may be made of gold (Au) is deposited on top of the advancing contact 104.

Figure 4:
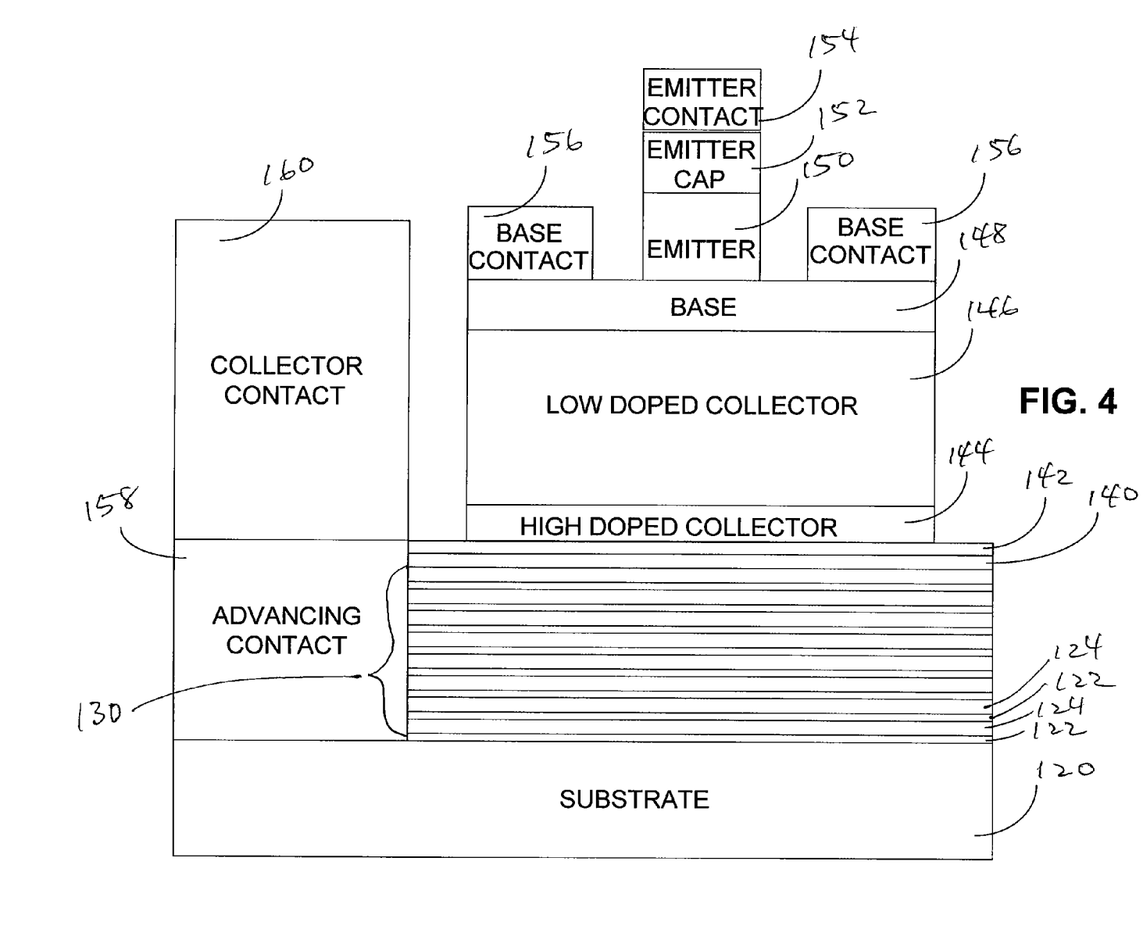
FIG. 4 is an elevation sectional view of an exemplary BJT with a modulation doped super-lattice sub-collector in accordance with the present disclosure.

An MDSL sub-collector may also be used to improve the performance of a bipolar junction transistor (BJT) and FIG. 4 is an elevation sectional view of an exemplary BJT with a MDSL sub-collector 130. It should be understood that FIG. 4 shows only one form of a BJT that could be fabricated with a MDSL sub-collector. For example, a BJT may be a conventional planar BJT with three differently doped semiconductor regions, the emitter region, the base region and the collector region, rather than the mesa device as shown in FIG. 4.

The MDSL sub-collector 130 may be fabricated on substrate 120 and consist of one or more MDSL layer sets. For example, FIG. 4 has eight MDSL layer sets. The first MDSL layer set includes a channel layer 122 and a doping pulse layer 124. Doping pulse layer 124 includes a first material with a wide band gap and a channel layer 124 includes a second material with a narrower band gap. The first MDSL layer set may also include spacer layers (not shown) with less doping than the doping pulse layer. The spacer layers are fabricated between the channel layer 122 and the doping pulse layer 124 and between the doping pulse layer 124 and the channel layer 122 in the second MDSL layer. Additional MDSL layer sets fabricated in the same manner may be stacked to achieve a desired reduction in collector resistance and a desired electron mobility.

The MDSL layer sets can be made of the materials shown in FIG. 2 for layers 52, 54, 56 and 58; however, other materials can be used that provide a doping pulse layer with a wide band gap and a channel layer with a narrower band gap.

Above the MDSL sub-collector 130 any layers and processing can be performed in order to implement a BJT. For the exemplary BJT of FIG. 4, the BJT may include a sub-collector cap 140, a contact and etch stop 142, a highly doped collector cap 144, a low doped collector 146, which is the intrinsic collector, a base 148, an emitter 150, an emitter cap 152, an emitter contact 154, and a base contact 156.

To contact each MDSL layer set in the MDSL sub-collector, an advancing contact 158 is diffused into a region of the MDSL sub-collector. An advancing contact 158 may also be referred to as a diffusing or sinking contact. The advancing contact 158 may be a refractory metal silicide. A surface contact 160, which may be made of tungsten is deposited on top of the advancing contact 158.

Figure 5:
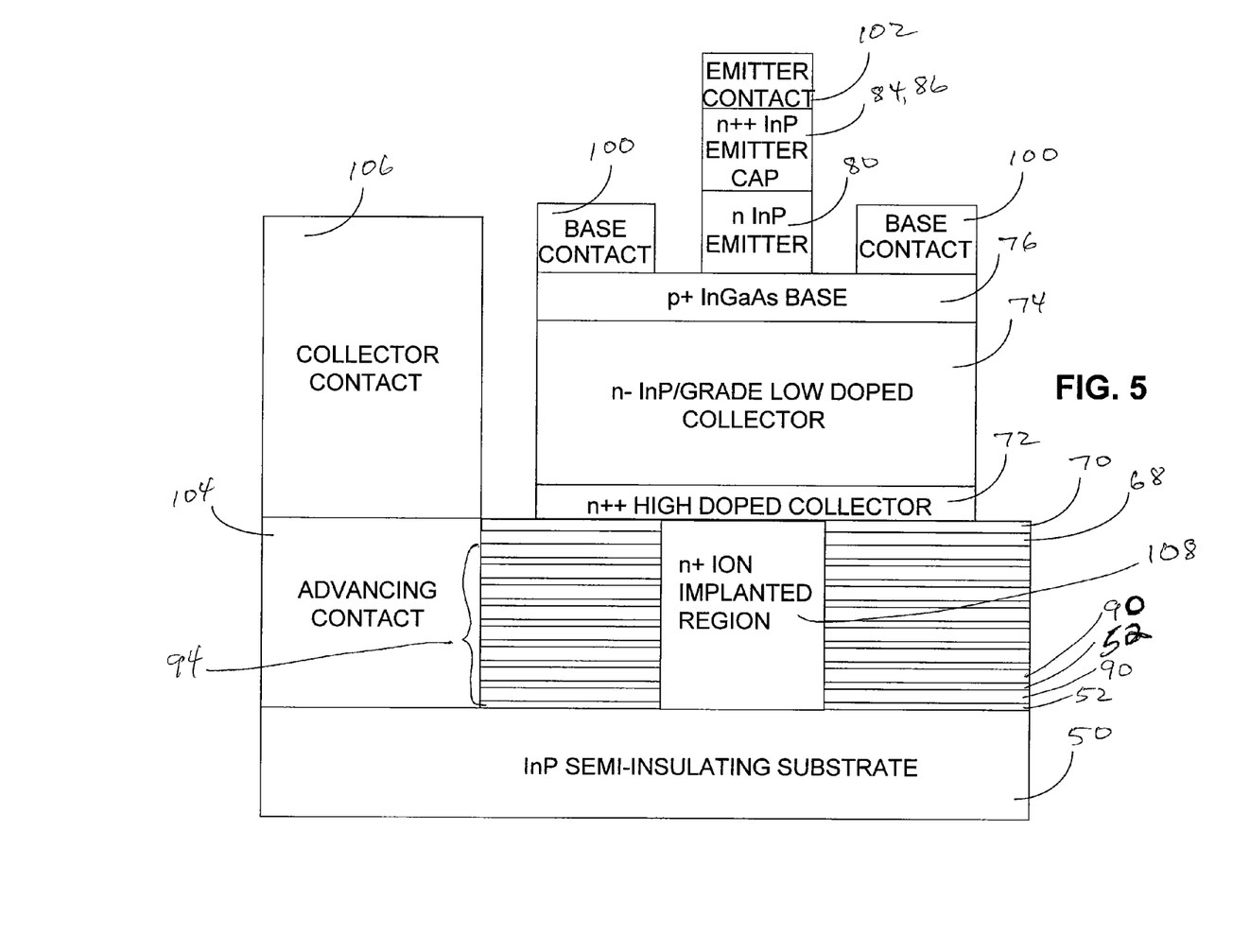
FIG. 5 is an elevation sectional view of an exemplary HBT with a modulation doped super-lattice sub-collector including an ion implant in accordance with the present disclosure.

FIG. 5 is an elevation sectional view of an exemplary HBT with a modulation doped super-lattice sub-collector including an ion implant in accordance with the present disclosure. The HBT structure of FIG. 5 is essentially identical to the exemplary HBT embodiment shown in FIG. 3; however, ions are implanted in a region 108 in the MDSL sub-collector.

The ion implanted region 108 provides vertical conductivity of carriers to the MDSL layer sets in the MDSL sub-collector which are furthest away from the collector. For example, referring to FIG. 5, the ion implanted region 108 provides vertical conductivity of carriers from collector 74 to the all the MDSL layer sets 94 including layer group 90 and channel layer 52 that are on top of semi-insulating substrate 50. This is particularly relevant to carriers which have little kinetic energy other than the thermal energy 3/2 kT present at any given temperature.

Figure 6A:
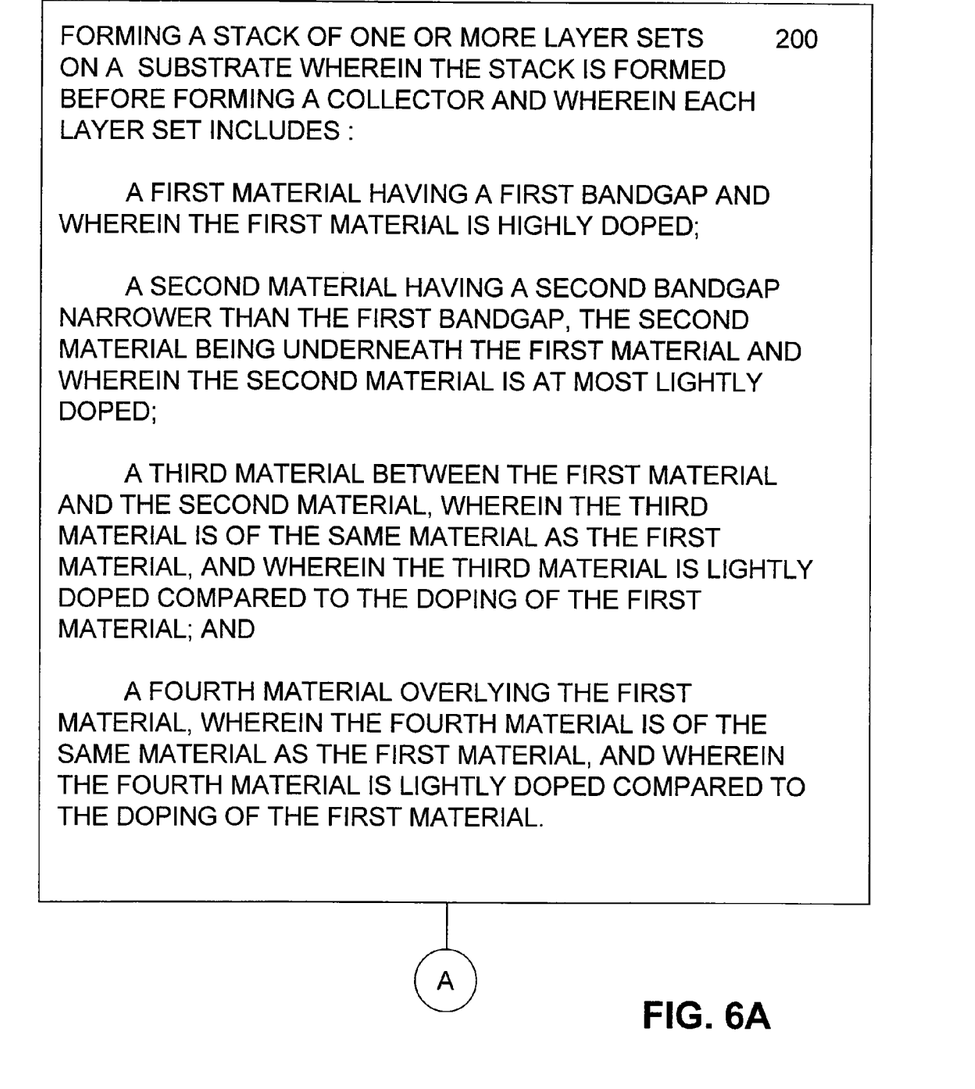
FIGS. 6A to 6E are flowcharts of exemplary methods of fabricating a HBT with a modulation doped super-lattice sub-collector in accordance with the present disclosure.

FIGS. 6A to 6E are flowcharts of exemplary methods of fabricating a HBT with a modulation doped super-lattice sub-collector in accordance with the present disclosure. In FIG. 6A step 200, a stack of one or more layer sets is grown on a substrate before growing a collector. Each layer set in the stack includes a first material, for example doping pulse layer 56 shown in FIG. 2, that is highly doped and that has a first bandgap and second material, for example channel layer 52 shown in FIG. 2, having a second bandgap that is narrower than the first bandgap of the first material. The second material is underneath the first material and is at most lightly doped. A third material, for example spacer layer 54 shown in FIG. 2, is between the first material and the second material. The third material is of the same material as the first material and is lightly doped compared to the doping of the first material. A fourth material, for example spacer layer 58 shown in FIG. 2, overlays the first material and is of the same material as the first material. The fourth material is also lightly doped compared to the doping of the first material.

Figure 6B:
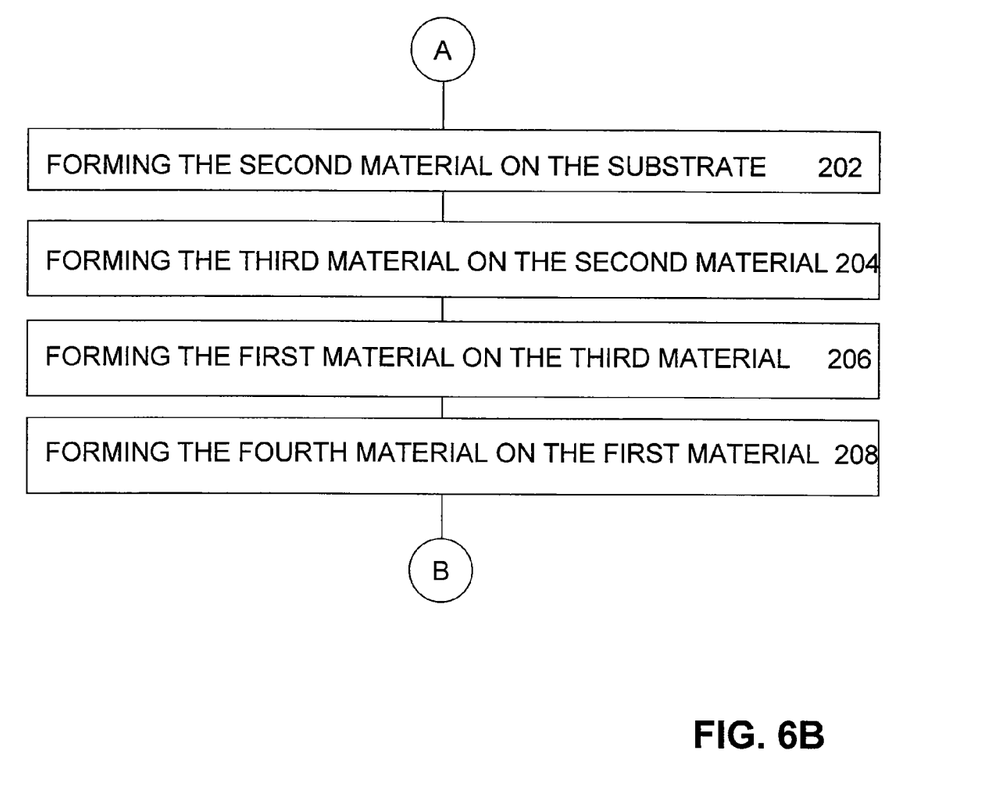

FIG. 6B shows the steps for forming the first layer set. The first layer set is formed on a substrate by forming in step 202 the second material, which is a channel layer 52, on a substrate, such as substrate 50 in FIG. 2. Then in step 204 the third material, which is a spacer layer 54, is formed on top of the second material. Then in step 206 the first material, which is a doping pulse layer 56, is formed on the third material. Finally in step 208 the fourth material, which is another spacer layer 58, is formed on the first material.

Figure 6C:
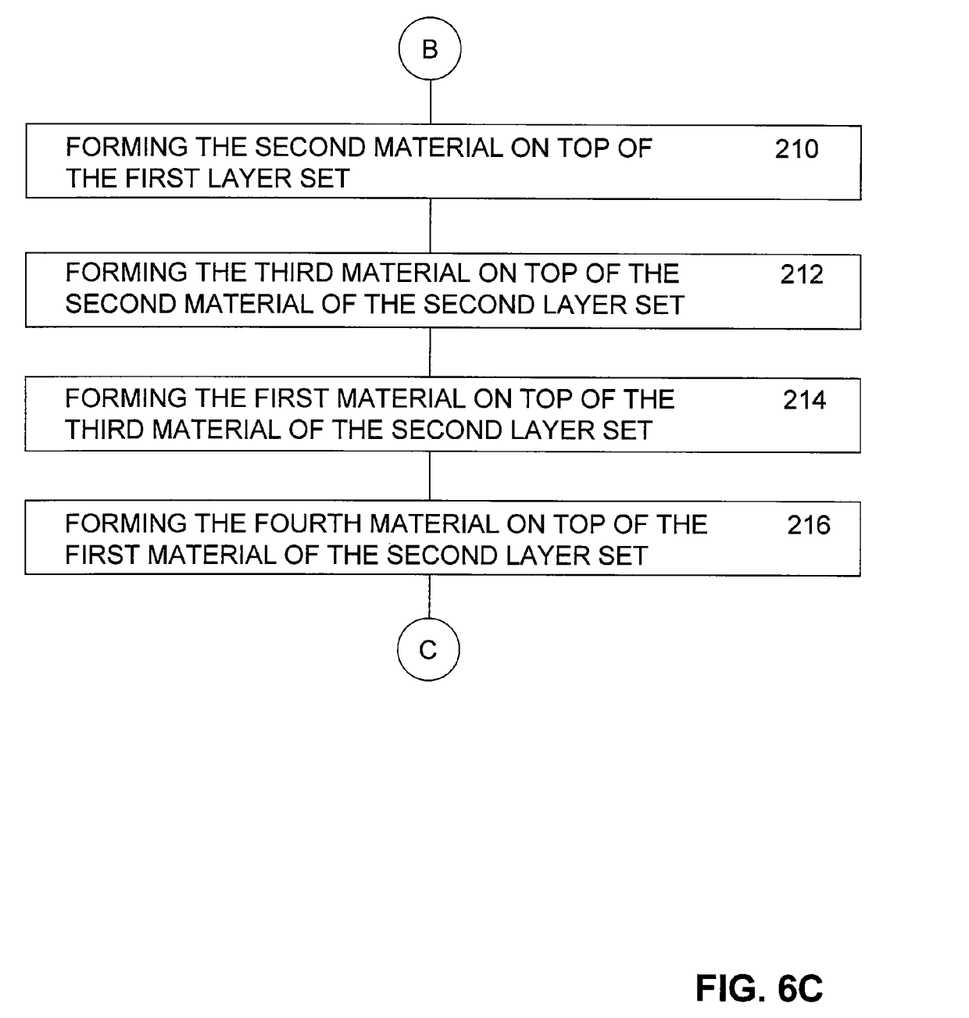

FIG. 6C shows the steps for forming a second layer set for the stack of layer sets. The key difference is that the second layer set and any additional layer sets are formed on top of the preceding layer set. In step 210 the second material, which is a channel layer 60, for the second layer set is formed on top of the first layer set formed as described above for FIG. 6B. Then the third material, which is a spacer layer 62, is formed on top of the second material of the second layer set in step 212. Then in step 214 the first material, which is a doping pulse layer 64, is formed on top of the third material of the second layer set. Finally, the fourth material, which is another spacer layer 66, is formed in step 216 on top of the first material of the second layer set. Additional layer sets, such as 3$^{rd}$, 4$^{th}$, 5th, and so on layer sets, can be formed using the same method.

Figure 6D:
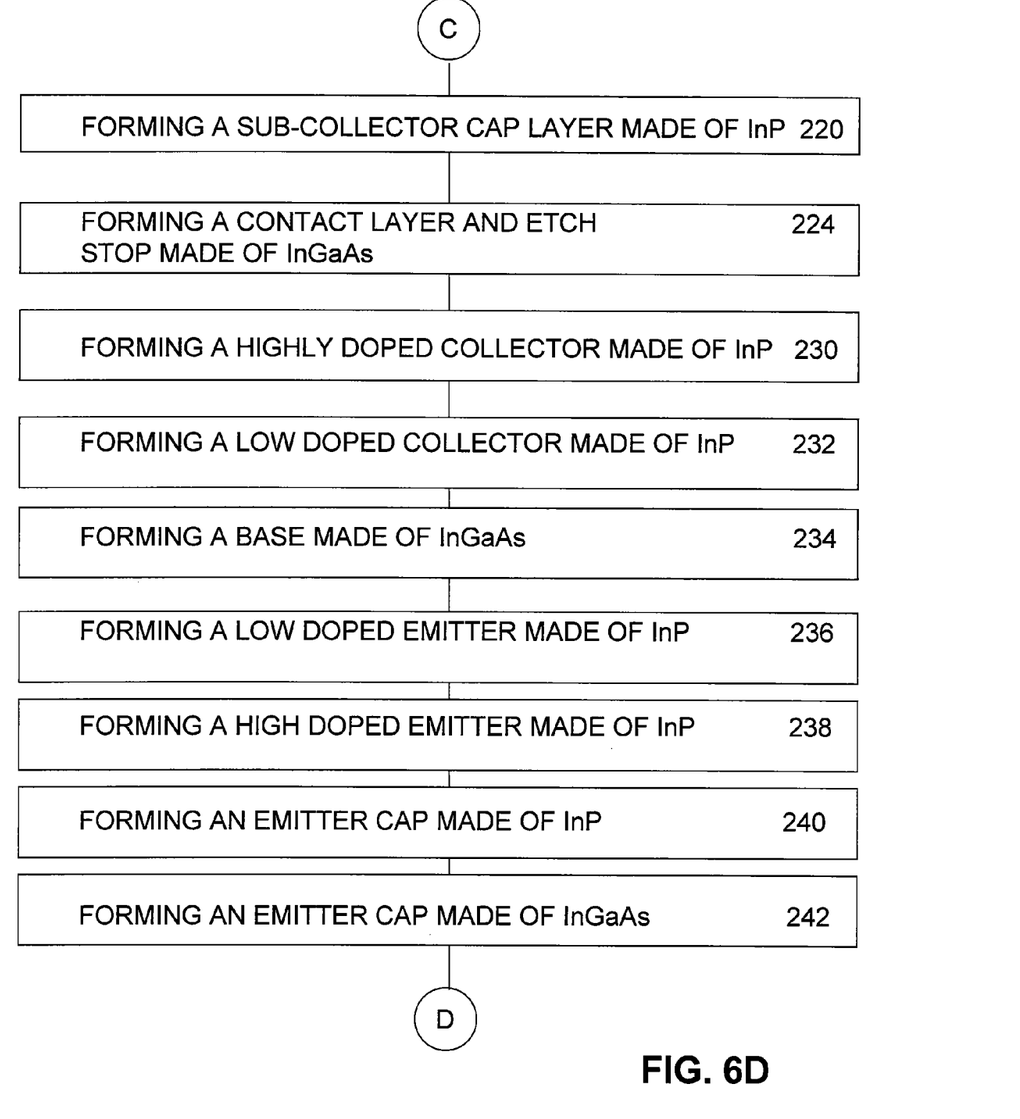

FIG. 6D shows an exemplary flow chart for forming HBT layers above the MDSL formed by the stack of layer sets. It should be understood that these steps may change for a particular HBT design. Also the layers above the stack of layer sets may be for a BJT rather than an HBT. For an exemplary HBT, corresponding to the HBT of FIG. 2, the steps as shown in FIG. 6D include forming a sub-collector cap layer 68 made of InP in step 220, forming a contact layer and etch stop 70 in step 224 made of InGaAs, forming a highly doped collector 72 made of InP in step 230, forming a low doped collector 74 made of InP in step 232, forming a base 76 made of InGaAs in step 234, forming a low doped emitter 80 made of InP in step 236, forming a high doped emitter 82 made of InP in step 238, forming an emitter cap 84 made of InP in step 240, and forming an emitter cap 86 made of InGaAs in step 242.

Figure 6E:
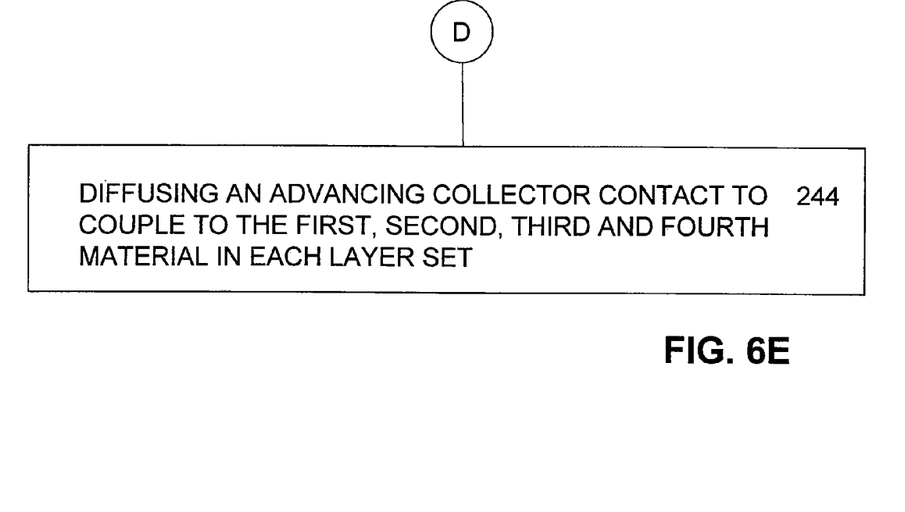

FIG. 6E is an exemplary flow chart of steps to make contact with the MDSL formed of the stack of layer sets. In step 244 an advancing collector contact is diffused to couple to the first, second, third and fourth material in each layer. As described above, for an HBT the advancing contact 104 can be gold (Au), germanium (Ge) and nickel (Ni). The surface contact 106 may be made of gold (Au). As described above, for a BJT the advancing contact 158 may be a refractory metal silicide and the surface contact 160 may be tungsten.

Figure 7:
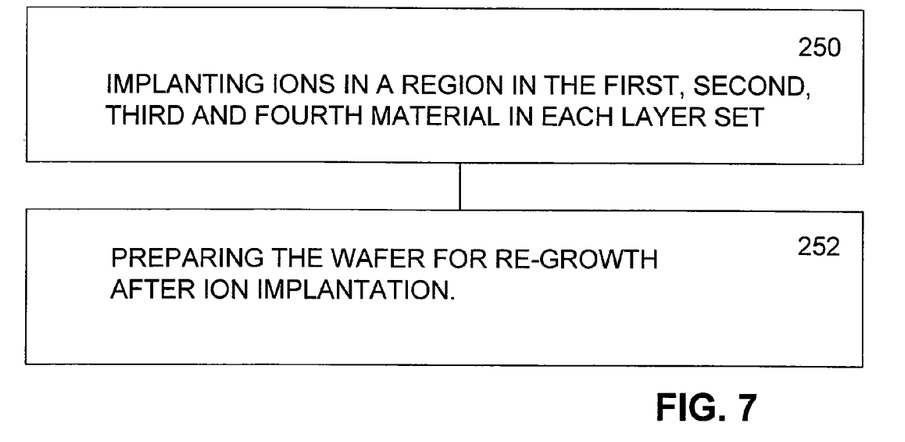
FIG. 7 is a flowchart of an exemplary method for fabricating a HBT with a modulation doped super-lattice sub-collector including an ion implant in accordance with the present disclosure.

FIG. 7 is a flowchart of an exemplary method for fabricating a HBT with a modulation doped super-lattice sub-collector including an ion implant in accordance with the present disclosure. These steps are applied after forming an MDSL by forming the stack of layer sets and before fabricating an HBT or BJT on top of the MDSL. For example, these steps would be performed before performing the steps in FIG. 6D to form an HBT. In step 250 ions are implanted into a region of the stack of layer sets and implanted into the first, second, third and fourth material in each layer set, as shown in FIG. 5. Then before fabricating an HBT or BJT, in step 252 the wafer is prepared for re-growth after ion implantation.

A modulation doped super-lattice sub-collector provides a sub-collector with lower doping concentrations and reduced total sub-collector thickness for a given sub-collector resistance. Use of a MDSL sub-collector may also provide reduced sub-collector resistance to provide improved performance for HBTs and BJTs.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

What is claimed is:

1. A bipolar junction transistor having an emitter, a base and a collector, the bipolar junction transistor comprising:
a stack of one or more layer sets adjacent the collector wherein each layer set comprises:
a first material having a first band gap and wherein the first material is highly doped; and
a second material having a second band gap narrower than the first band gap, wherein the second material is at most lightly doped.

2. The bipolar junction transistor of claim 1 wherein each layer set further comprises:
a third material between the first material and the second material;
wherein the third material is of the same material as the first material; and
wherein the third material is lightly doped compared to the doping of the first material; and
a fourth material overlying the first material;
wherein the fourth material is of the same material as the first material; and
wherein the fourth material is lightly doped compared to the doping of the first material.

3. The bipolar junction transistor of claim 2 further comprising:
an advancing collector contact coupled to each first, second, third and fourth material in each layer set.

4. The bipolar junction transistor of claim 3 wherein the advancing contact comprises a refractory metal silicide.

5. The bipolar junction transistor of claim 1 wherein the first band gap of the first material and the second band gap of the second material form a quantum well.

6. The bipolar junction transistor of claim 1 wherein a junction between the first material and the second material is a heterojunction.

7. The bipolar junction transistor of claim 2 further comprising:
an ion implanted region in the first, second, third and fourth material in each layer set.

8. A heterojunction bipolar transistor having an emitter, a base, and a collector, the heterojunction bipolar transistor comprising:
a stack of one or more layer sets adjacent the collector wherein each layer set comprises:
a first material having a first band gap and wherein the first material is highly doped; and
a second material having a second band gap narrower than the first band gap, wherein the second material is at most lightly doped.

9. The heterojunction bipolar transistor of claim 8 wherein each layer set further comprises:
a third material between the first material and the second material;
wherein the third material is of the same material as the first material; and
wherein the third material is lightly doped compared to the doping of the first material; and
a fourth material overlying the first material;
wherein the fourth material is of the same material as the first material; and
wherein the fourth material is lightly doped compared to the doping of the first material.

10. The heterojunction bipolar transistor of claim 9 further comprising:
an advancing collector contact coupled to the first, second, third and fourth material in each layer set.

11. The heterojunction bipolar transistor of claim 10 wherein the advancing contact comprises gold, germanium and nickel.

12. The heterojunction bipolar transistor of claim 8 wherein the first band gap of the first material and the second band gap of the second material form a quantum well.

13. The heterojunction bipolar transistor of claim 8 wherein a junction between the first material and the second material is a heterojunction.

14. The heterojunction bipolar transistor of claim 9 further comprising:
an ion implanted region in the first, second, third and fourth material in each layer set.

15. The heterojunction bipolar transistor of claim 9 wherein:
the first material comprises InP with a doping level of approximately $2*10^{19}$ cm$^{-3}$;
the second material comprises InGaAs with a doping level of approximately $5*10^{15}$ cm$^{-3}$;
the third material comprises InP with a doping level of approximately $2*10^{17}$ cm$^{-3}$; and
the fourth material comprises InP with a doping level of approximately $2*10^{17}$ cm$^{-3}$.

16. A method of fabricating a heterojunction bipolar transistor having an emitter, a base, and a collector, the method comprising:
forming a stack of one or more layer sets on a substrate wherein the stack is formed before forming the collector and wherein each layer set comprises:
a first material having a first band gap and wherein the first material is highly doped;
a second material having a second band gap narrower than the first band gap, the second material being underneath the first material and wherein the second material is at most lightly doped;
a third material between the first material and the second material;
wherein the third material is of the same material as the first material; and
wherein the third material is lightly doped compared to the doping of the first material; and
a fourth material overlying the first material;
wherein the fourth material is of the same material as the first material; and
wherein the fourth material is lightly doped compared to the doping of the first material.

17. The method of claim 16 wherein forming a stack of one or more layer sets comprises:
forming a first layer set comprising:
forming the second material on the substrate;
forming the third material on the second material;
forming the first material on the third material; and
forming the fourth material on the first material.

18. The method of claim 17 wherein forming a stack of one or more layer sets further comprises:
forming a second layer set comprising:
forming the second material on top of the first layer set;
forming the third material on top of the second material of the second layer set;
forming the first material on top of the third material of the second layer set; and
forming the fourth material on top of the first material of the second layer set.

19. The method of claim 16 further comprising:
diffusing an advancing collector contact to couple to the first, second, third and fourth material in each layer set.

20. The method of claim 16 wherein the first band gap of the first material and the second band gap of the second material form a quantum well.

21. The method of claim 16 wherein a junction between the first material and the second material is a heterojunction.

22. The method of claim 16 further comprising:
    implanting ions in a region in the first, second, third and fourth material in each layer set.

23. The method of claim 22 wherein the ion implant region is a continuous region in the first, second, third and fourth material in each layer set.

24. The method of claim 22 further comprising preparing the wafer for re-growth after ion implantation.

25. The method of claim 16 wherein:
    the first material comprises InP with a doping level of approximately $2*10^{19}$ cm$^{-3}$;
    the second material comprises InGaAs with a doping level of approximately $5*10^{15}$ cm$^{-3}$;
    the third material comprises InP with a doping level of approximately $2*10^{17}$ cm$^{-3}$; and
    the fourth material comprises InP with a doping level of approximately $2*10^{17}$ cm$^{-3}$.

26. The method of claim 25 further comprising:
    forming a sub-collector cap layer made of InP;
    forming a contact layer and etch stop made of InGaAs;
    forming a highly doped collector made of InP;
    forming a low doped collector made of InP;
    forming a base made of InGaAs;
    forming a low doped emitter made of InP;
    forming a high doped emitter made of InP;
    forming an emitter cap made of InP; and
    forming an emitter cap made of InGaAs.

27. A method of fabricating a bipolar junction transistor having an emitter, a base and a collector, the method comprising:
    forming a stack of one or more layer sets adjacent the collector wherein each layer set comprises:
        a first material having a first band gap and wherein the first material is highly doped; and
        a second material having a second band gap narrower than the first band gap, wherein the second material is at most lightly doped.

28. The method of claim 27 wherein each layer set further comprises:
    a third material between the first material and the second material;
        wherein the third material is of the same material as the first material; and
        wherein the third material is lightly doped compared to the doping of the first material; and
    a fourth material overlying the first material;
        wherein the fourth material is of the same material as the first material; and
        wherein the fourth material is lightly doped compared to the doping of the first material.

29. The method of claim 28 further comprising:
    diffusing an advancing collector contact coupled to each first, second, third and fourth material in each layer set.

30. The method of claim 29 wherein the advancing contact comprises a refractory metal silicide.

31. The method of claim 27 wherein the first band gap of the first material and the second band gap of the second material form a quantum well.

32. The method of claim 27 wherein a junction between the first material and the second material is a heterojunction.

33. The method of claim 28 further comprising:
    implanting an ion implanted region in the first, second, third and fourth material in each layer set.

34. A method of fabricating a heterojunction bipolar transistor having an emitter, a base, and a collector, the method comprising:
    forming a stack of one or more layer sets adjacent the collector wherein each layer set comprises:
        a first material having a first band gap and wherein the first material is highly doped; and
        a second material having a second band gap narrower than the first band gap, wherein the second material is at most lightly doped.

35. The method of claim 34 wherein each layer set further comprises:
    a third material between the first material and the second material;
        wherein the third material is of the same material as the first material; and
        wherein the third material is lightly doped compared to the doping of the first material; and
    a fourth material overlying the first material;
        wherein the fourth material is of the same material as the first material; and
        wherein the fourth material is lightly doped compared to the doping of the first material.

36. The method of claim 35 further comprising:
    diffusing an advancing collector contact coupled to the first, second, third and fourth material in each layer set.

37. The method of claim 36 wherein the advancing contact comprises gold, germanium and nickel.

38. The method of claim 34 wherein the first band gap of the first material and the second band gap of the second material form a quantum well.

39. The method of claim 34 wherein a junction between the first material and the second material is a heterojunction.

40. The method of claim 35 further comprising:
    implanting an ion implanted region in the first, second, third and fourth material in each layer set.

41. The method of claim 35 wherein:
    the first material comprises InP with a doping level of approximately $2*10^{19}$ cm$^{-3}$;
    the second material comprises InGaAs with a doping level of approximately $5*10^{15}$ cm$^{-3}$;
    the third material comprises InP with a doping level of approximately $2*10^{17}$ cm$^{-3}$; and
    the fourth material comprises InP with a doping level of approximately $2*10^{17}$ cm$^{-3}$.

* * * * *